(12) United States Patent
Saito

(10) Patent No.: US 11,982,577 B2
(45) Date of Patent: May 14, 2024

(54) THERMOCOUPLE MOUNTING STRUCTURE AND THERMOCOUPLE MOUNTING METHOD

(71) Applicant: MITSUBISHI HEAVY INDUSTRIES, LTD., Tokyo (JP)

(72) Inventor: Makoto Saito, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 244 days.

(21) Appl. No.: 17/320,418

(22) Filed: May 14, 2021

(65) Prior Publication Data

US 2021/0372857 A1    Dec. 2, 2021

(30) Foreign Application Priority Data

May 29, 2020   (JP) .................................. 2020-093954

(51) Int. Cl.
  *G01K 7/02*     (2021.01)
  *H10N 10/00*    (2023.01)
  (Continued)

(52) U.S. Cl.
  CPC .............. *G01K 7/02* (2013.01); *H10N 10/00* (2023.02); *H10N 10/01* (2023.02); *H10N 10/10* (2023.02);
  (Continued)

(58) Field of Classification Search
  CPC ........ H10N 10/00; H10N 10/01; H10N 10/10; H10N 10/80; H10N 10/817
  See application file for complete search history.

(56) References Cited

U.S. PATENT DOCUMENTS 3,342,874 A * 9/1967 Taylor .................. C07C 381/00
                                                    562/605
4,541,728 A * 9/1985 Hauser .................. G01K 17/20
                                                    374/30
(Continued)

FOREIGN PATENT DOCUMENTS

JP    3453302         10/2003
JP    2004031147 A *  1/2004  ........... H05B 1/0213

OTHER PUBLICATIONS

Verdy, C. et al., "In Situ Temperature Measurement Using Embedded Micro-Thermocouples in Vacuum Plasma Sprayed Multi-layered Structures", Paper No. itsc1998p0821, pp. 821-824; 4 pages https://doi.org/10.31399/asm.cp.itsc1998p0821 (Year: 1998).*

(Continued)

Primary Examiner — Tamir Ayad
(74) Attorney, Agent, or Firm — Wenderoth, Lind & Ponack, L.L.P.

(57) ABSTRACT

A structure and a method for mounting thermocouple on an intermetallic compounds such as TiAl by suppressing occurrence of cracks are provided. A thermocouple mounting structure is provided with a substrate, a coating formed on the substrate and a foil joined on the coating, and sandwiches a thermocouple between the substrate and the foil. A thermocouple mounting method includes forming a coating on a substrate and welding a foil on the coating, and the welding includes arranging a thermocouple so that the substrate and the foil sandwiches the thermocouple. Occurrence of cracks in the substrate formed with intermetallic compounds can be suppressed by providing a thermal spray coating between the substrate and the foil.

4 Claims, 5 Drawing Sheets

(51) Int. Cl.
    *H10N 10/01*     (2023.01)
    *H10N 10/10*     (2023.01)
    *H10N 10/80*     (2023.01)
    *H10N 10/817*     (2023.01)
    *B23K 20/16*     (2006.01)
    *B23K 103/24*     (2006.01)

(52) U.S. Cl.
    CPC ........... H10N 10/80 (2023.02); H10N 10/817 (2023.02); *B23K 20/16* (2013.01); *B23K 2103/24* (2018.08)

(56) References Cited

U.S. PATENT DOCUMENTS 5,733,255 A * 3/1998 Dinh .................... A61N 1/30
                                          604/20
7,753,584 B2 * 7/2010 Gambino ................ G01K 7/04
                                          374/179

OTHER PUBLICATIONS

Kracke, Art, "Superalloys, The Most Successful Alloy System of Modern Times—Past, Present, and Future", 7th International Symposium on Superalloy 718 and Derivatives, pp. 13-50. (Year: 2010).*
Machine translation of JP-2004031147-A (Year: 2004).*

* cited by examiner

THERMOCOUPLE MOUNTING STRUCTURE AND THERMOCOUPLE MOUNTING METHOD

CROSS REFERENCE

This application claims priority of Japanese Patent Application No. 2020-93954 filed on May 29, 2020, the disclosure of which is incorporated herein by reference.

TECHNICAL FIELD

The present invention relates to a thermocouple mounting structure and a thermocouple mounting method, and for example, can be suitably used to mount a thermocouple on a substrate of intermetallic compounds.

BACKGROUND

A method of using a thermocouple to measure temperature is known. A thermocouple is excellent as a temperature sensor that measures high temperature of several hundred degrees Celsius to several thousand degrees Celsius. As a method of fixing a thermocouple to a target of temperature measurement, a method of spot welding a foil on a surface of the target to sandwich the thermocouple is known.

As a material that withstand high temperatures of several hundred degrees Celsius, intermetallic compounds such as Titanium Aluminum (TiAl) alloys are known. Intermetallic compounds such as TiAl have excellent characteristics of high strength and light weight.

In order to measure temperature of an intermetallic compound such as TiAl by use of a thermocouple, it is necessary to fix the thermocouple to the intermetallic compound such as TiAl. However, intermetallic compounds such as TiAl have a problem that cracks occur when spot welding is performed.

In connection with the above, Patent Literature 1 (Japanese Patent No. 3453302) discloses an invention related to a method of joining a TiAl alloy member and a structural steel material. This method of joining is characterized of using, as an intermediate material, an alloy having a thermal expansion coefficient equivalent to that of the TiAl alloy, forming a convex part on one surface of a joint surface of the TiAl alloy member and the intermediate material and a concave part on the other surface, and performing joining of the TiAl alloy member and the intermediate material by friction welding in a state in that the surface on which the convex part is formed and the surface on which the concave part is formed are abutted.

CITED REFERENCE

Patent Literature

[Patent Literature 1] Japanese Patent No. 3453302

SUMMARY

A structure of mounting a thermocouple on an intermetallic compound such as TiAl by suppressing occurrence of cracks and a method therefor will be provided. Other problems and new features will be clear from disclosures of the present specification and attached drawings.

In one or more embodiments, a thermocouple mounting structure is provided with a substrate, a coating formed on the substrate and a foil joined on the coating, and sandwiches a thermocouple between the substrate and the foil.

In one or more embodiments, a thermocouple mounting method includes forming a coating on a substrate and welding a foil on the coating, and the welding includes arranging a thermocouple so that the substrate and the foil sandwiches the thermocouple.

In one or more embodiments described above, occurrence of cracks in a substrate formed with an intermetallic material can be suppressed by providing a thermal spray coating between the substrate and a foil.

DETAILED DESCRIPTION

One or more embodiments to carry out a thermocouple mounting structure and a thermocouple mounting method according to the present invention will be described below with reference to attached drawings.

Embodiment

Figure 1A:
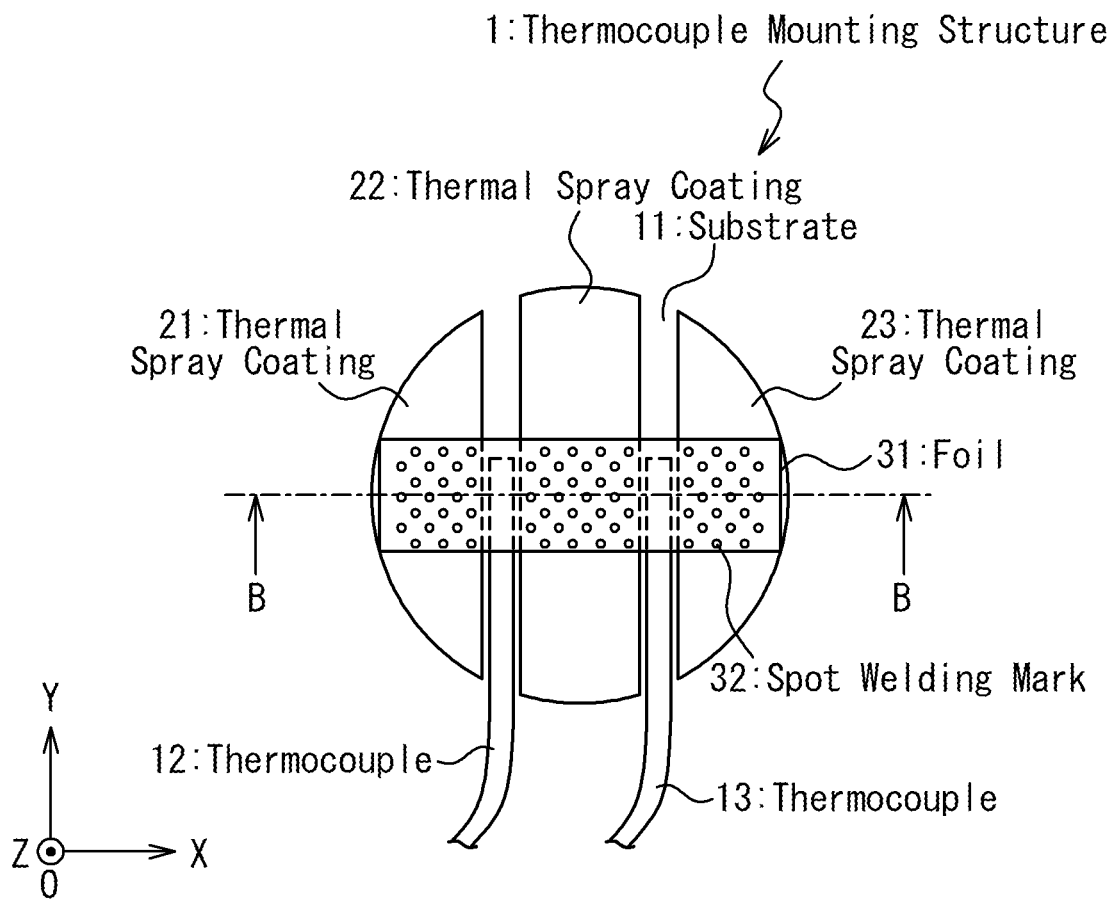
FIG. 1A is a plan view that shows a configuration example of a thermocouple mounting structure according to one or more embodiments.
Figure 1B:
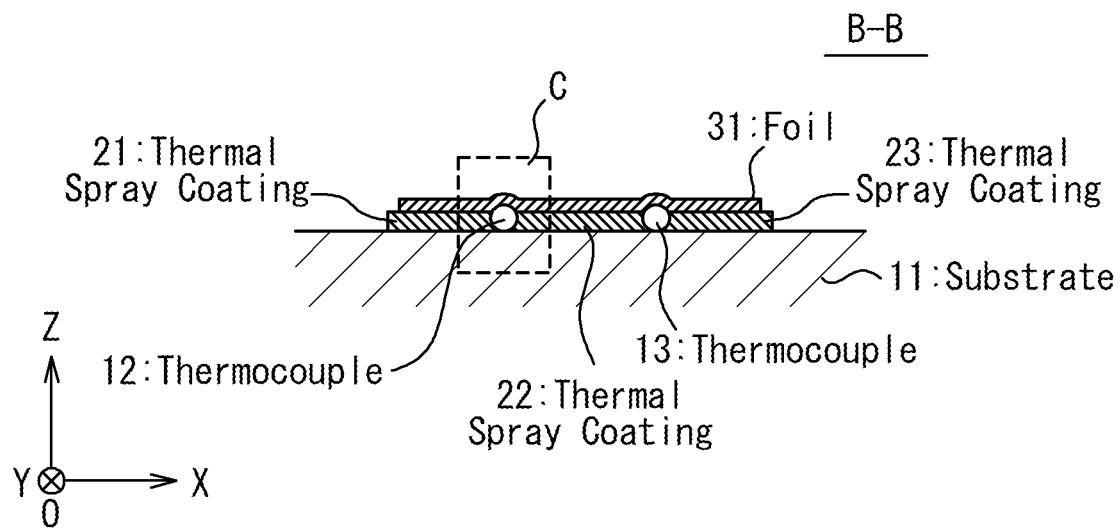
FIG. 1B is a cross-sectional view by a cross-section line B-B in FIG. 1A, that shows a configuration example of a thermocouple mounting structure according to one or more embodiments.
Figure 1C:
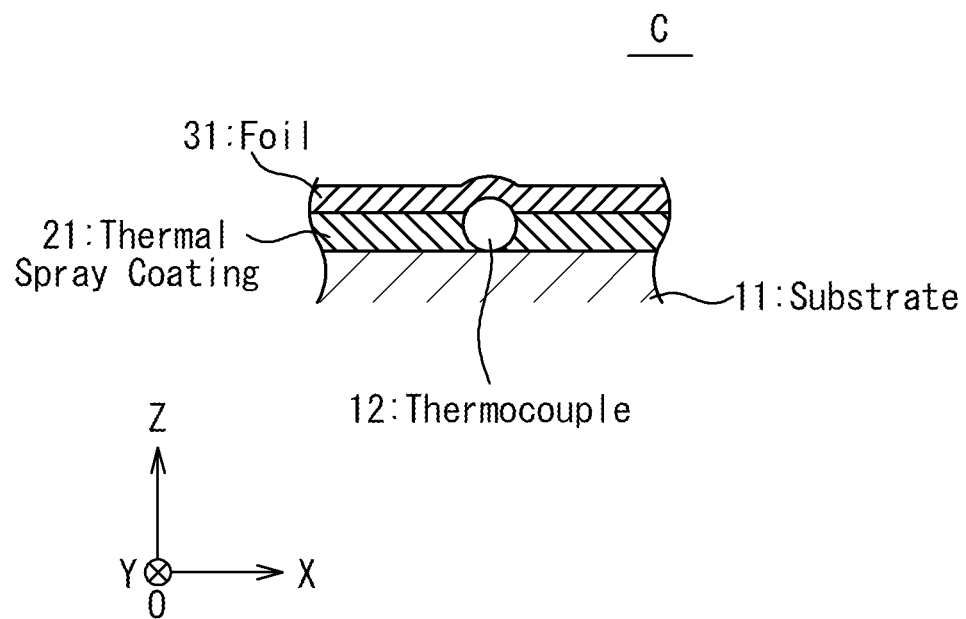
FIG. 1C is an enlarged view of an area C of the cross-sectional view in FIG. 1B.
Figure 1D:
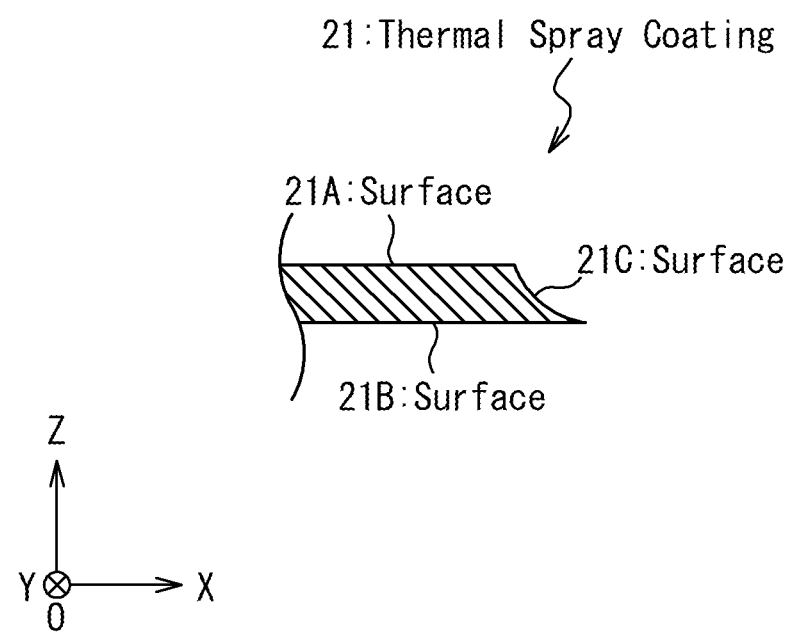
FIG. 1D is a diagram to explain about surfaces of a thermal spray coating of an enlarged area of FIG. 1C.

A configuration example of a thermocouple mounting structure 1 according to one or more embodiments will be described with reference to FIGS. 1A to 1D. FIG. 1A is a plan view that shows a configuration example of a thermocouple mounting structure according to one or more embodiments. FIG. 1B is a cross-sectional view by a cross-section line B-B in FIG. 1A, that shows a configuration example of a thermocouple mounting structure according to one or more embodiments. FIG. 1C is an enlarged view of an area C of the cross-sectional view in FIG. 1B. FIG. 1D is a diagram to explain about surfaces of a thermal spray coating of an enlarged area of in FIG. 1C.

Components of the thermocouple mounting structure 1 shown in FIGS. 1A and 1B will be described. The thermocouple mounting structure 1 is provided with a substrate 11, thermal spray coatings 21, 22 and 23, and a foil 31. There are several spot welding marks 32 on a surface of the foil 31.

Positional relationship and connection relationship of the components shown in FIGS. 1A and 1B will be described. The thermal spray coatings 21, 22 and 23 are formed on a surface of the substrate 11. The thermal spray coating 21 and the thermal spray coating 22 are separated by a distance sufficient for arranging a thermocouple 12. The thermocouple 12 is arranged along the surface of the substrate 11 and are arranged between the thermal spray coating 21 and the thermal spray coating 22. Similarly, the thermal spray coating 22 and the thermal spray coating 23 are separated by a distance sufficient for arranging a thermocouple 13. In addition, the thermocouple 13 is arranged along the surface of the substrate 11 and is arranged between the thermal spray coating 22 and the thermal spray coating 23.

The foil 31 is joined on surfaces of the thermal spray coatings 21, 22 and 23 opposite to the substrate 11. This joint may be realized by spot welding for example. When joining the foil 31 by spot welding, it is preferable to perform at a plurality of locations for each of the thermal spray coating 21, 22 and 23. In FIG. 1A, the locations where spot welding is performed are indicated as spot welding marks 32. As shown in FIG. 1C, the thermocouple 12 is sandwiched between the substrate 11 and the foil 31. Similarly, the thermocouple 13 is also sandwiched between the substrate 11 and the foil 31. Therefore, it is preferable that thicknesses of the thermal spray coatings 21, 22 and 23 are smaller than diameters of the thermocouples 12 and 13.

A shape of a surface of the thermal spray coating 21 in contact with the thermocouple 12 will be described. As shown in FIG. 1D, a part of the surface of the thermal spray coating 21 in contact with the foil 31 will be referred to as a surface 21A, a part in contact with the substrate 11 will be referred to as a surface 21B and a part in contact with the thermocouple 12 will be referred to as a surface 21C. Herein, it is preferable that the surface 21C is a curved surface having a shape complementary to a shape of a side surface of the thermocouple 12. In other words, if a part of the thermocouple 12 in contact with the thermal spray coating 21 has a cylindrical shape, it is preferable that the surface 21C, that is a part of the surface of the thermal spray coating 21 in contact with the thermocouple 12, is a curved surface having a shape of a side surface inside a cylinder circumscribed to the thermocouple 12. A part of the surface of the thermal spray coating 22 in contact with the thermocouple 12 also has a shape similar to the surface 21C so that the thermocouple 12 can be stably arranged between the thermal spray coatings 21 and 22. In other words, the thermocouple 12 are stable. However, in fact, there may be an appropriate margin between the thermocouple 12 and the thermal spray coatings 21 and 22. In other words, a curvature radius of the surface 21C may be appropriately larger than a radius of the thermocouple 12.

It is preferable that parts of the surfaces of the thermal spray coatings 22 and 23 in contact with the thermocouple 13 are curved surfaces having shapes complementary to a side surface of the thermocouple 13, similarly to the case of the surface 21C.

Figure 2:
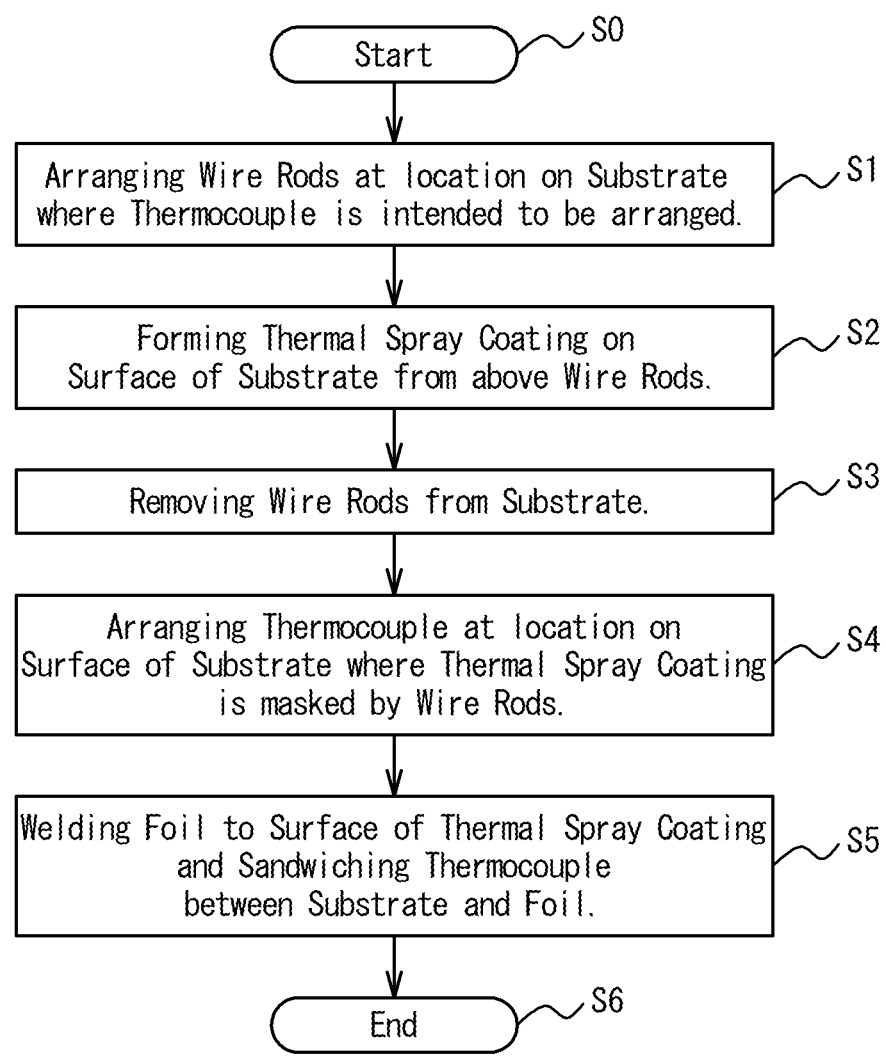
FIG. 2 is a flowchart that shows an example of each process of a thermocouple mounting method according to one or more embodiments.

A method of manufacturing the thermocouple mounting structure 1 according to one or more embodiments, that is, a thermocouple mounting method according to one or more embodiment, will be described with reference to FIG. 2. FIG. 2 is a flowchart that shows an example of each process of a thermocouple mounting method according to one or more embodiments. The flowchart in FIG. 2 is provided with seven processes in total, from a 0-th step S0 to a sixth step S6. The flowchart in FIG. 2 starts from the 0-th step S0. The first step S1 is executed after the 0-th step S0.

In the first step S1, wire rods 41 and 42 are arranged at locations on the surface of the substrate 11 where the thermocouples 12 and 13 are intended to be arranged. Herein, the wire rods 41 and 42 act as masks in formation of thermal spray coatings 21, 22 and 23 and secure locations where the thermocouples 12 and 13 can be in direct contact with the substrate 11 as temperature measurement target. Therefore, it is preferable that the wire rod 41 has a diameter same as that of the thermocouple 12 or a diameter appropriately larger than that of the thermocouple 12. Similarly, it is preferable that the wire rod 42 has a diameter same as that of the thermocouple 13 or a diameter appropriately larger than that of the thermocouple 13.

In addition, it is preferable that the wire rods 41 and 42 are formed of a material that withstands high temperature generated in thermal spraying process. Piano wire may be considered as a material suitable for the wire rods 41 and 42 for example.

It should be noted that in the first step S1 blasting may be performed before or after arranging the wire rods 41 and 42 in order to make the surface of the substrate 11 in a state suitable for forming the thermal spray coatings.

Figure 3A:
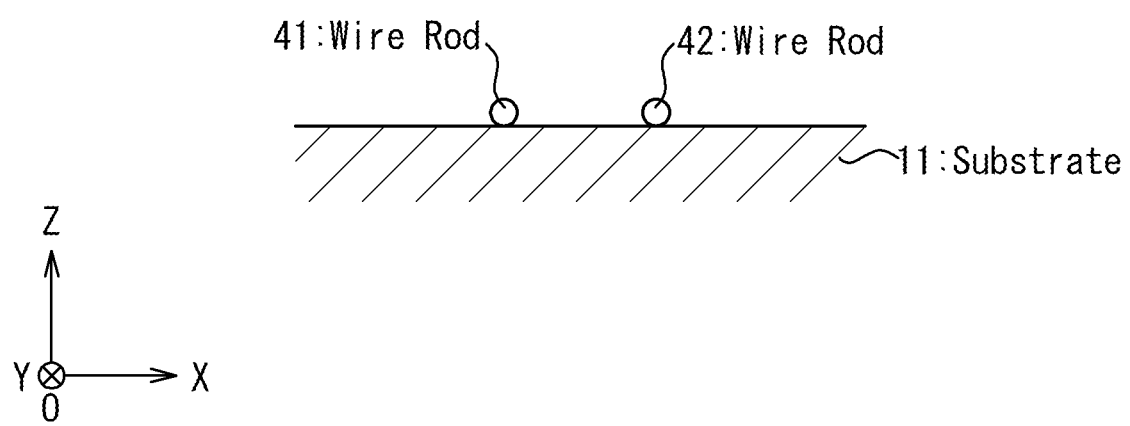
FIG. 3A is a cross-sectional view that shows a configuration example of a thermocouple mounting structure at a first step of a thermocouple mounting method according to one or more embodiments.

FIG. 3A is a cross-sectional view that shows a configuration example of a thermocouple mounting structure 1 at a first step S1 of a thermocouple mounting method according to one or more embodiments. The second step S2 is executed after the first step S1.

In the second step S2, the thermal spray coatings 21, 22 and 23 are formed on the surface of the substrate 11 from above the wire rods 41 and 42. It is preferable to appropriately select a material of the thermal spray coatings in accordance with conditions such as a material of the substrate 11, a material of the foil 31, adhesion to the substrate 11 and heat resistance. As an example, inventors have verified that, when the material of the substrate 11 is TiAl and the material of the foil 31 is Nickel (Ni), Ni-based alloys and Cobalt (Co)-based alloys are suitable as the material of the thermal spray coatings.

As such Ni-based alloys, Nickel Aluminum (NiAl) alloys, Nickel Cobalt Chrome Aluminum Yttrium (NiCoCrAlY) alloys and Nickel Chrome Aluminum Yttrium (NiCrAlY) alloys are known. In addition, as such Co-based alloys, Cobalt Nickel Chrome Aluminum Yttrium (CoNiCrAlY) alloys, Cobalt Chrome Aluminum Yttrium (CoCrAlY) alloys or Cobalt Chrome Aluminum Tungsten (CoCrAlW) alloys are known.

In other words, when the material of the substrate 11 is TiAl and the material of the foil 31 is Ni, it is preferable that the material of the thermal spray coatings includes at least one of NiAl, NiCoCrAlY, NiCrAlY, CoNiCrAlY, CoCrAlY or CoCrAlW.

As a method of forming the thermal spray coatings 21, 22 and 23, flame spray method, atmospheric plasma spray method, decompression plasma spray method, cold spray method and the like are known.

It is preferable that thicknesses of the thermal spray coatings 21, 22 and 23 are appropriately adjusted by considering influences to joining the foil 31 thereon by spot welding, diameters of the thermocouples 12 and 13 that are intended to be fixed by the foil 31, possibility of delamination due to the residual stress after spraying, and the like. As an example, the inventors have verified that, when the diameter of the thermocouples 12 and 13 is 0.5 mm, thermal spray coatings 21, 22 and 23 of which a thickness is larger than 100 micrometer (μm) and less than 300 μm are suitable.

Figure 3B:
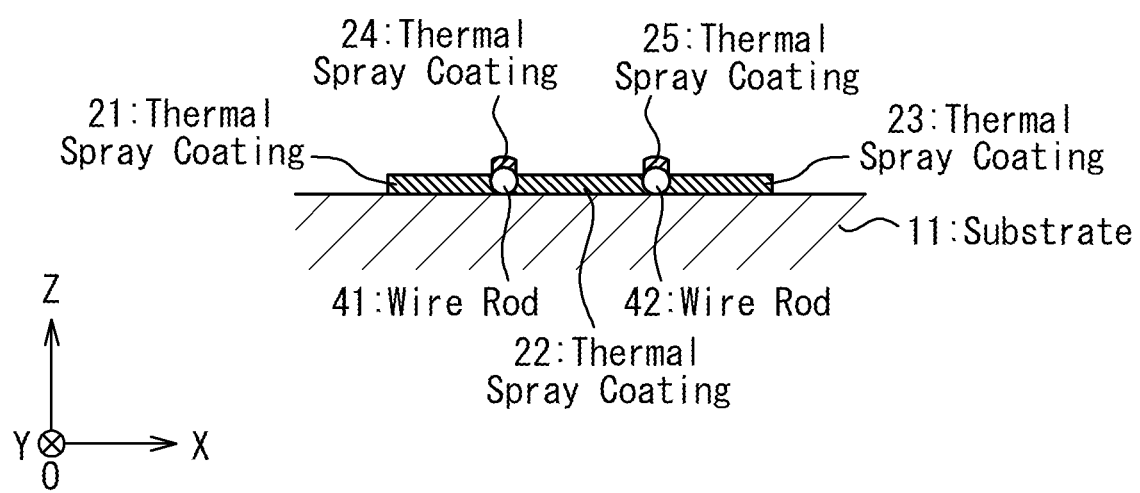
FIG. 3B is a cross-sectional view that shows a configuration example of a thermocouple mounting structure at a second step of a thermocouple mounting method according to one or more embodiments.

FIG. 3B is a cross-sectional view that shows a configuration example of a thermocouple mounting structure 1 at a second step S2 of a thermocouple mounting method according to one or more embodiments. The third step S3 is executed after the second step S2.

In the third step S3, wire rods 41 and 42 are removed from the substrate 11. At that time, the thermal spray coating 24 formed on the wire rod 41 and the thermal spray coating 25 formed on the wire rod 42 are also removed from the substrate 11. As a result, a gap with a width approximatively equal to the diameter of the wire rod 41 is formed between the thermal spray coating 21 and the thermal spray coating 22. Similarly, a gap with a width approximatively equal to the diameter of the wire rod 42 is formed between the thermal spray coating 22 and the thermal spray coating 23.

In addition, as shown in FIG. 1D, a surface 21C having a curved surface complementary to the side surface of the wire rod 41 is formed at a part of the surface of the thermal spray coating 21 which was in contact with the wire rod 41. Similarly, a part of the surfaces of the thermal spray coating 22 which was in contact with the wire rod 41 also has a curved surface complementary to the side surface of the wire rod 41. In addition, a part of the surface of each of the thermal spray coatings 22 and 23 which was in contact with the wire rod 42 has a curved surface complementary to the side surface of the wire rod 42.

Figure 3C:
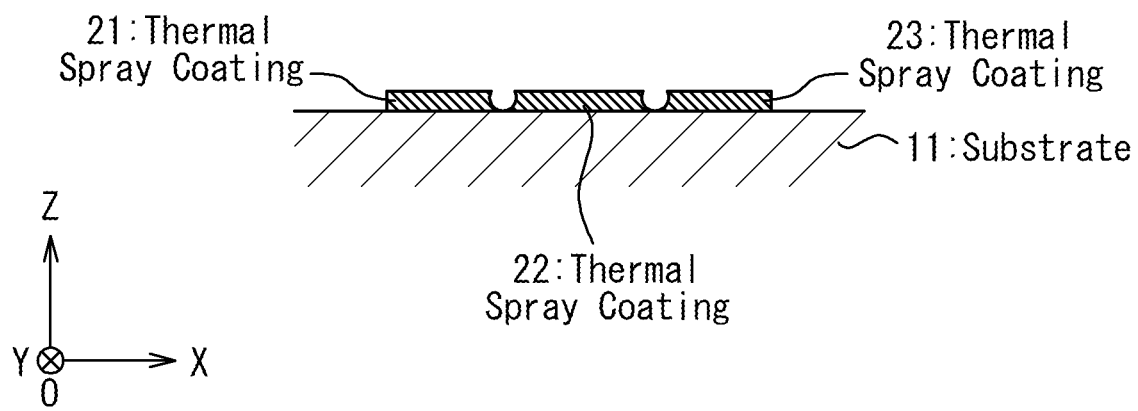
FIG. 3C is a cross-sectional view that shows a configuration example of a thermocouple mounting structure at a third step of a thermocouple mounting method according to one or more embodiments.

FIG. 3C is a cross-sectional view that shows a configuration example of a thermocouple mounting structure 1 at a third step S3 of a thermocouple mounting method according to one or more embodiments. The fourth step S4 will be executed after the third step S3.

In the fourth step S4, thermocouples 12 and 13 are arranged at the locations on the surface of the substrate 11 where the thermal spray coatings 21, 22 and 23 are masked by the wire rods 41 and 42. At that time, the thermocouples 12 and 13 are stable because the thermocouples 12 and 13 are arranged at the parts of the surfaces of the thermal spray coatings 21, 22 and 23 which were in contact with the wire rods 41 and 42. In other words, the thermocouples 12 and 13 are stable by being arranged at locations where the wire rods 41 and 42 are removed.

Figure 3D:
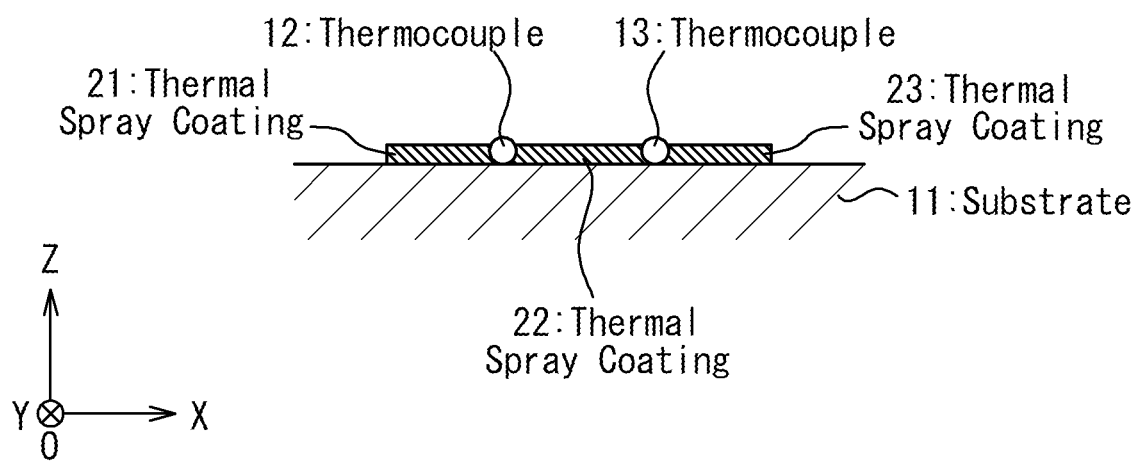
FIG. 3D is a cross-sectional view that shows a configuration example of a thermocouple mounting structure at a fourth step of a thermocouple mounting method according to one or more embodiments.

FIG. 3D is a cross-sectional view that shows a configuration example of a thermocouple mounting structure 1 at a fourth step S4 of a thermocouple mounting method according to one or more embodiments. The fifth step S5 is executed after the fourth step S4.

In the fifth step S5, the foil 31 is welded to the surface of the thermal spray coatings 21, 22 and 23. By doing so, the thermocouples 12 and 13 are sandwiched between the substrate 11 and the foil 31.

The welding of the foil 31 is performed by spot welding for example. It is preferable that a number of times to perform spot welding for each of the thermal spray coatings 21, 22 and 23 is appropriately set in accordance with an area where the foil 31 overlaps. On the other hand, as an example, spot welding may be performed several tens of times each in order to fix the thermocouples 12 and 13 with sufficient strength.

The sixth step S6 is executed after the fifth step S5, the thermocouple mounting structure 1 shown in FIGS. 1A and 1B is complete and the thermocouple mounting method according to the present embodiment is completed.

According to the thermocouple mounting structure and the thermocouple mounting method of the present embodiment, the thermal spray coatings 21, 22 and 23 act as cushioning material and occurrence of cracks in the substrate 11 due to spot welding of the foil 31 can be suppressed.

Although the invention made by the inventors has been specifically described above based on embodiments, it is needless to say that the present invention is not limited to the above-described embodiments and can be variously modified without departing from the gist thereof. In addition, each feature described in the above-described embodiment can be freely combined within a technically consistent range.

What is claimed is:

1. A thermocouple mounting structure comprising:
   a substrate;
   a coating formed on the substrate; and
   a foil joined on the coating,
   wherein the substrate and the foil sandwich a thermocouple,
   wherein the substrate and the foil are in direct contact with the thermocouple,
   wherein a material of the substrate includes a titanium aluminum (TiAl) alloy, and
   wherein a material of the coating includes at least one of: a nickel aluminum (NiAl) alloy; a nickel cobalt chrome aluminum yttrium (NiCoCrAlY) alloy; a nickel chrome aluminum yttrium (NiCrAlY) alloy; a cobalt nickel chrome aluminum yttrium (CoNiCrAlY) alloy; a cobalt chrome aluminum yttrium (CoCrAlY) alloy; or a cobalt chrome aluminum tungsten (CoCrAlW) alloy.

2. The thermocouple mounting structure according to claim 1,
   wherein a material of the foil includes nickel (Ni).

3. The thermocouple mounting structure according to claim 1,
   wherein the coating comprises:
      a first coating part provided between the substrate and the foil; and
      a second coating part provided between the substrate and the foil,
   wherein the thermocouple is arranged between the first coating part and the second coating part, and
   wherein each of the first coating part and the second coating part comprises:
      a first surface in contact with the substrate;
      a second surface in contact with the foil; and
      a third surface in contact with the thermocouple.

4. The thermocouple mounting structure according to claim 3, wherein the third surface of each of the first coating part and the second coating part comprises a curved surface complementary to a shape of a surface of the thermocouple in contact with the coating.

* * * * *